(12) United States Patent
Bartoli et al.

(10) Patent No.: US 6,854,040 B1
(45) Date of Patent: Feb. 8, 2005

(54) NON-VOLATILE MEMORY DEVICE WITH BURST MODE READING AND CORRESPONDING READING METHOD

(75) Inventors: Simone Bartoli, Cambiago (IT); Antonino Geraci, Lercole Fridoli (IT); Mauro Sali, Sant'Angelo Lodigiano (IT); Lorenzo Bedarida, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/717,938

(22) Filed: Nov. 21, 2000

(30) Foreign Application Priority Data

Nov. 25, 1999  (EP) ............................................. 99830723

(51) Int. Cl.$^7$ .......................... G06F 12/00; G06F 13/28; G11C 8/04

(52) U.S. Cl. ....................... 711/167; 711/169; 711/218; 365/230.09

(58) Field of Search ............................ 365/220, 230.09, 365/233.5; 711/103, 167, 169, 217, 218

(56) References Cited

U.S. PATENT DOCUMENTS

| | | | | |
|---|---|---|---|---|
| 5,159,672 A | * | 10/1992 | Salmon et al. | 711/167 |
| 5,696,917 A | | 12/1997 | Mills et al. | 395/401 |
| 5,784,705 A | * | 7/1998 | Leung | 711/169 |
| 5,966,724 A | | 10/1999 | Ryan | 711/105 |
| 5,986,918 A | | 11/1999 | Lee | 365/103 |
| 6,026,465 A | * | 2/2000 | Mills et al. | 711/103 |
| 6,172,936 B1 | * | 1/2001 | Kitazaki | 365/233 |
| 6,327,175 B1 | * | 12/2001 | Manapat et al. | 365/154 |

FOREIGN PATENT DOCUMENTS

EP  0591009  4/1994  ......... G11C/11/408

\* cited by examiner

*Primary Examiner*—Gary J Portka
(74) *Attorney, Agent, or Firm*—Lisa K. Jorgenson; Allen, Dyer, Doppelt, Milbrath & Gilchrist, P.A.

(57) ABSTRACT

A read control circuit and a reading method for an electronic memory device integrated on a semiconductor includes a non-volatile memory matrix with associated row and column decoders connected to respective outputs of an address counter. An address transition detect (ATD) circuit detects an input transition as the memory device is being accessed, and read amplifiers and attendant registers transfer the data read from the memory matrix to the output. The read control circuit includes a detection circuit to which is input a clock signal and a logic signal to enable reading in the burst mode. A burst read mode control logic circuit is connected downstream of the detection circuit. The method includes accessing the memory matrix in a random read mode, detecting a request for access in the burst read mode, and executing the parallel reading of a plurality of memory words during a single period of time clocked by the clock signal.

36 Claims, 5 Drawing Sheets

NON-VOLATILE MEMORY DEVICE WITH BURST MODE READING AND CORRESPONDING READING METHOD

FIELD OF THE INVENTION

The present invention relates to non-volatile memories, and specifically concerns a memory of the flash EEPROM type. More particularly, the invention relates to a read control circuit for an electronic memory device integrated on a semiconductor, and includes a non-volatile memory matrix with associated row and column decoders which are connected to respective outputs of an address counter. An address transition detect (ATD) circuit detects an input transaction as the memory device is being accessed, and read amplifiers and associated registers transfer the data read from the memory to the output. The invention also relates to a method of reading data contained in an integrated non-volatile memory device.

BACKGROUND OF THE INVENTION

Current microprocessors and microcontrollers require input data at ever faster rates which exceed the limits of conventional memory technologies. Manufacturers of semiconductor memory devices are developing progressively faster memory architectures to allow the speed of the memories to be improved. One of these techniques is the burst mode of synchronous reading. This burst read mode allows the microprocessor to read data from the memory at a faster rate than in the customary random read mode.

At first, the microprocessor only supplies the memory address to the memory. The microprocessor then supplies a clock signal, and based upon a reading at a random access rate, the data is delivered from the memory at each rising edge of the clock signal. The frequency of the clock signal can be much higher than that of the random read signal. As a result, the data transfer rate can be increased significantly.

The next addresses are internally generated by the memory device. However, burst reading in Flash memories is limited by the number of successive words at the predetermined starting address. Since the memory usually can handle only four successive words, the term synchronous page mode applies.

Current semiconductor non-volatile memory devices can support the random read mode, which is asynchronous, as well as the burst read mode, which is synchronous. The standard read mode is, however, the random mode. Two different constructions are commonly used to enable burst reading.

A first approach uses a sequence of enable control signals. To operate in the burst read mode, the memory device is provided with three additional control pins. These control pins allow interface with a wide range of microprocessors. The control pins are generally designated as LBA (Load Burst Address), BAA (Burst Address Advance), and CLK Clock).

The burst read mode comprises an addressing step and a corresponding data step. During the addressing step, the pin LBA must be held low for one clock period. On the rising edge of the clock signal, the starting address of the burst mode is loaded into an internal counter of an address bus.

During the data step, the first available data of the burst mode is accessible after an access time $t_{ACC}$ after the rising edge of the clock signal. For the next data, the signal on the pin BAA is activated, and the rising edge of the clock signal on the pin CLK will increase the count in the counter and supply the remaining data in the appropriate sequence within the specified access time $t_{BACC}$. The data sequence is supplied for the duration of the signal at the pin BAA.

The accompanying FIG. 1 shows a graph of some signals plotted against the same time base for a memory device operated in the burst read mode previously described. This first approach has a major drawback in that, once the memory has entered the burst read mode, only this mode is permitted. To return to the random read mode, another control sequence needs to be provided or the configuration register needs to be re-initialized.

A second approach writes into a configuration register incorporated to the memory device. This approach is described in U.S. Pat. No. 5,903,496, for example. This second approach is even more elaborate than the previous one, since the bursting order, the clock signal frequency and the burst length are fixed. To change any of these values, the configuration register must be re-written.

SUMMARY OF THE INVENTION

An object of the present invention is to provide a method for implementing read operations in the burst mode in a fully automatic manner, which is not limited by the number of memory words that follows the access starting address.

Another object of the present invention is to provide a novel mode of burst reading for electronic non-volatile memory devices integrated in a semiconductor.

A further object of the present invention is to provide a novel mode of burst reading for electronic non-volatile memory devices integrated in a semiconductor, which needs neither special control sequences nor writing phases of internal registers.

The concept of the present invention is to automatically activate the burst read mode after a first random reading, and reading in parallel a number of words internally of the memory once a first reading is performed in the random mode, which would therefore take the same time as a random access. A number of words read in the burst mode are made available for presentation at the memory output. The time taken to serially output the memory words read in parallel is utilized to effect a new reading at the next address.

A read control circuit for an electronic memory device integrated on a semiconductor substrate is provided. The electronic memory device comprises a non-volatile memory matrix with associated row and column decoders connected to respective outputs of an address counter, an ADT circuit for detecting an input transition as the electronic memory device is being accessed, and read amplifiers and associated registers for transferring data read from the electronic memory device to an output thereof.

The read control circuit preferably comprises a burst read detection circuit including a first input for receiving a clock signal and a second input for receiving a logic signal to enable reading in a burst mode, and a burst read control logic circuit connected downstream of the burst read detection circuit. Outputs of the burst read control logic circuit are preferably connected to the read amplifiers and the associated registers to activate a parallel reading of at least one memory word during a single period of the clock signal.

The method aspect of the invention is for reading data stored in an integrated electronic memory device including at least one non-volatile memory matrix. The method preferably comprises accessing the memory matrix in a random read mode, detecting a request for access in a burst read mode, and executing a parallel reading of at least one memory word during a single time period clocked by a clock signal.

BRIEF DESCRIPTION OF THE DRAWINGS

The features and advantages of the circuit and of the method according to the present invention will be apparent in the following description of embodiments thereof, given by way of non-limitative examples with reference to the accompanying drawings.

DETAILED DESCRIPTION OF THE PREFERRED EMBODIMENTS

Figure 1:
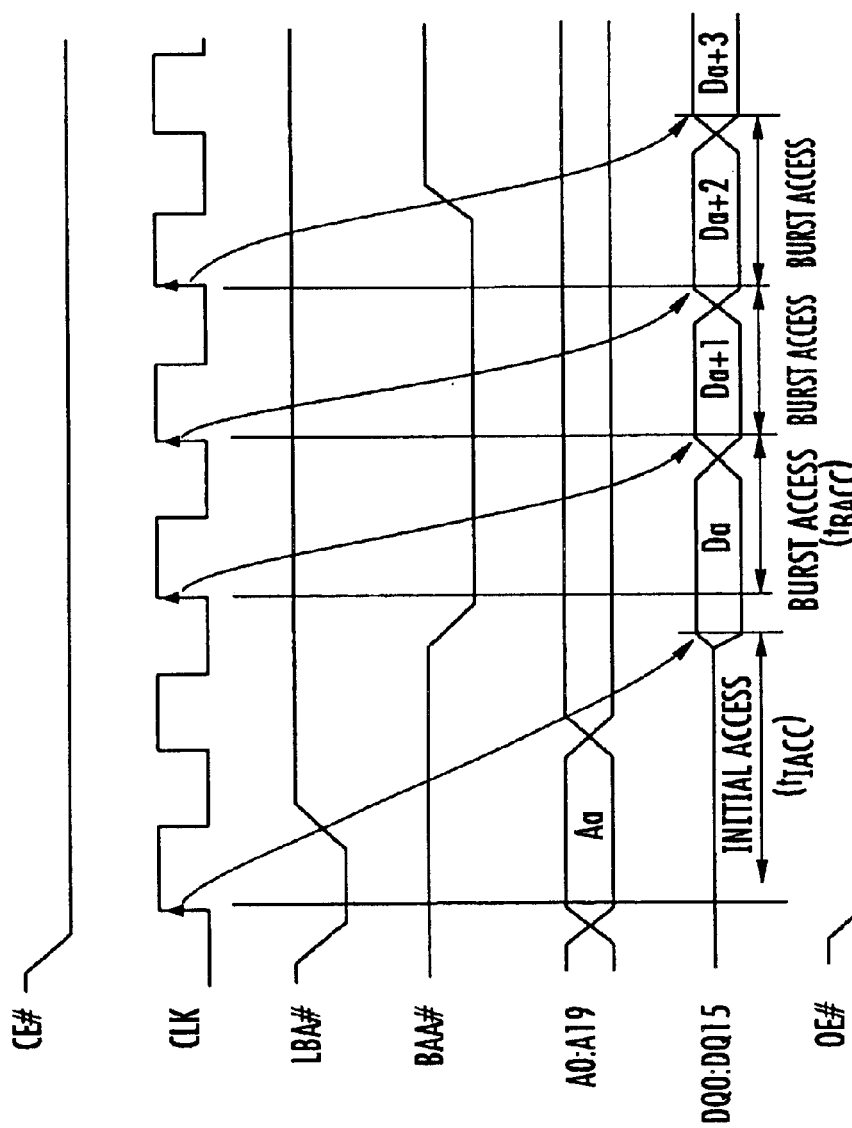
FIG. 1 graphically illustrates control signals plotted against a common time base as they appear in a memory device being operated in a conventional burst read mode according to the prior art.
Figure 2:
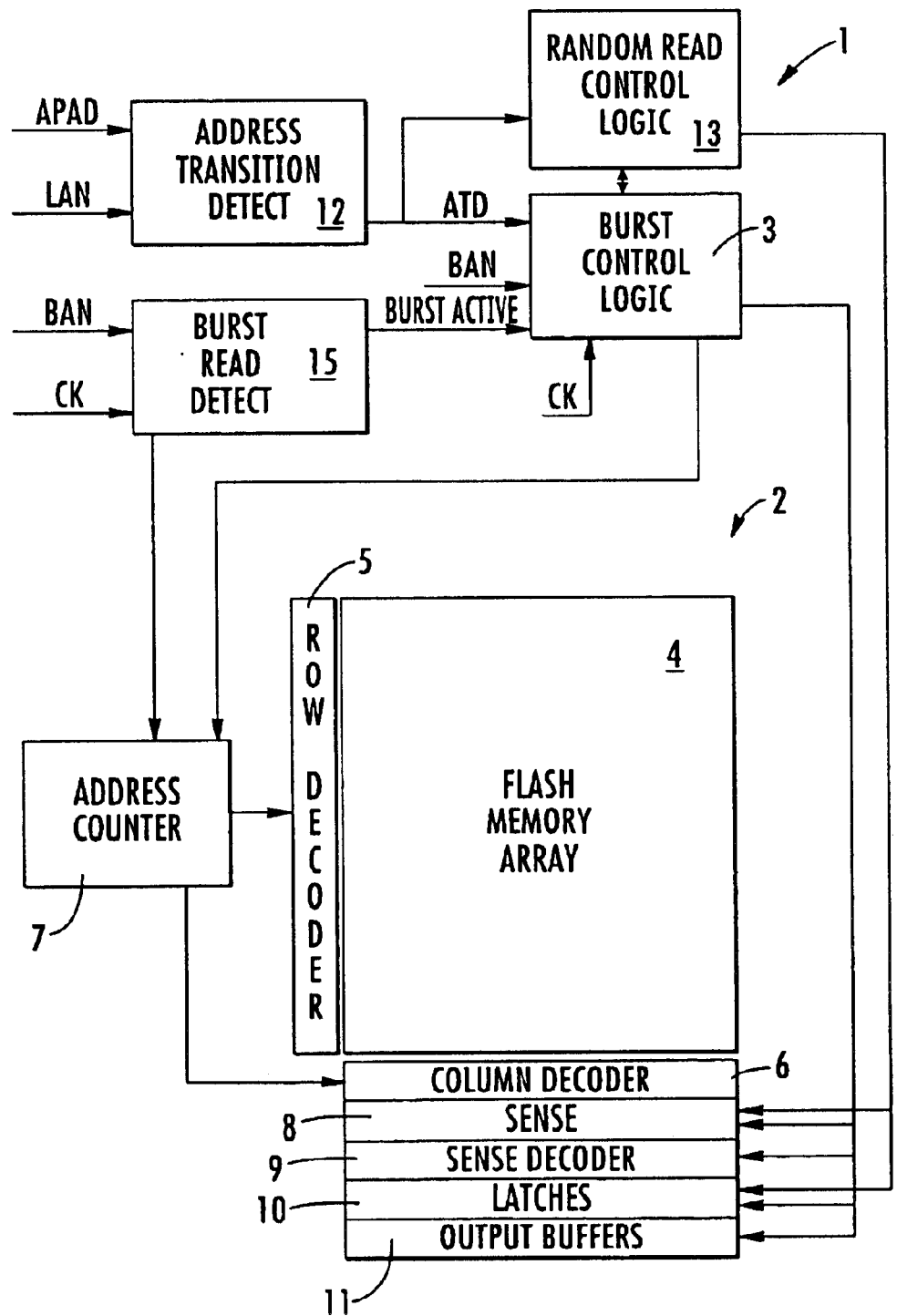
FIG. 2 illustrates a block diagram of a read circuit embodying a non-volatile memory device according to the present invention.

Referring to the drawing figures, and in particular to FIG. 2, a portion of a read circuit according to the present invention for a semiconductor integrated non-volatile memory device 2 is generally shown at 1 in schematic form. The memory 2 is connected to a microprocessor or a microcontroller, and can even be a type of memory integrated with the microprocessor in a single integrated circuit chip.

The construction of the read circuit portion 1 will now be described. A specific burst read mode will also be described further herein. The memory device 2 is a non-volatile memory, such as a semiconductor Flash EEPROM incorporating a memory matrix 4 and a corresponding row 5 and column 6 decoder. An address counter 7 has outputs connected to both the row decoder 5 and the column decoder 6. A conventional series of read amplifiers 8, read decoders 9, latch registers 10, and output buffer stages 11 provide data external the memory device 2.

To implement the burst read mode according to the present invention, three control pins have been added to the memory device 2. A first pin is arranged to receive a clock signal. A second pin LAN (Latch Address) is arranged to receive a valid address signal, and a third pin BAN (Burst Address advaNce) is arranged to receive a burst address advance command. The same acronyms will be used hereinafter to designate the pins and the corresponding electrical signals received thereon.

The circuit portion 1 comprises a burst read control logic 3 which is input with a signal ATD, a signal BAN, a signal BURST ACTIVE indicating an active burst read mode, and a clock signal CK. The control logic 3 is a state machine wherein the internal clock corresponds to the external clock signal CK as filtered by the signal BURST ACTIVE generated from a block 15 to be described below.

Figure 4:
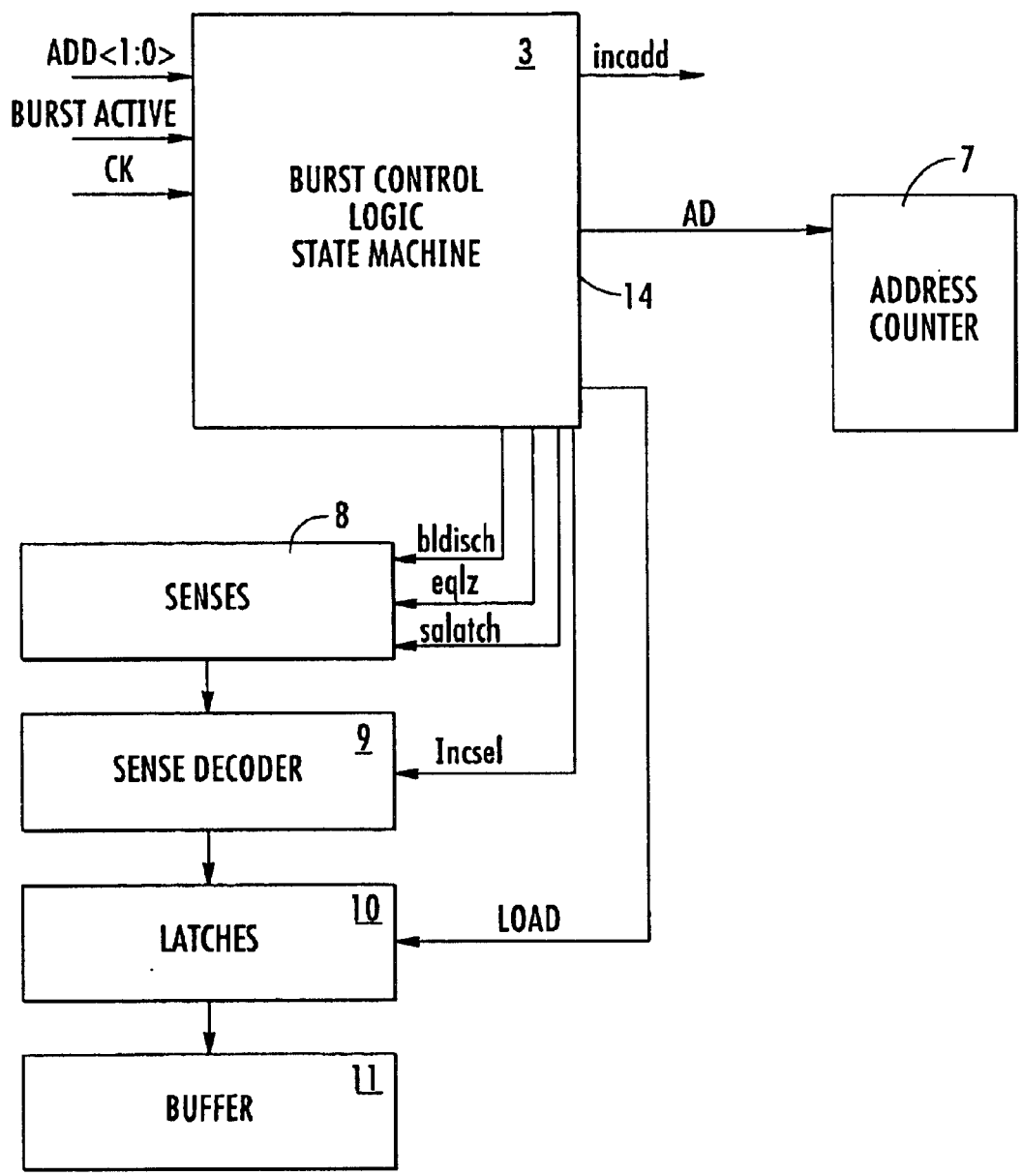
FIG. 4 illustrates a detailed block diagram of the read circuit illustrated in FIG. 2.

Advantageously, the control logic 3 has a first output AD for outputting a data wait signal "incadd" directed to the microprocessor, and a second output 14 is connected to the internal address counter 7 of the memory device. To generate the signal AD, the control logic 3 must also be input the two least significant addresses. In FIG. 4, this feature is highlighted by the inputs A<1:0>.

The address counter 7 stores the initial address, and the following increments are controlled by the signal incadd. The control logic 3 is also connected to the components 8, 9, 10 and 11. The control logic 3 is connected bidirectionally to a control logic 13 for random reading, which is input directly the signal ATD alone. This signal ATD is supplied conventionally from an ATD circuit 12 being input a first signal APAD, which is generated (i.e., brought to a high logic value) upon a state transition occurring at one of the addressing terminals, and the signal LAN received on the pin LAN.

The control logic 13 is further connected to the components 8 and 10. The first read step is always a random type and is handled by the control logic 13. It is only at the end of the first internal reading that the two (random or burst) read modes can be differentiated.

Advantageously in this invention, the circuit portion 1 is equipped with a burst mode detection circuit 15 adapted to automatically detect the need for a burst type of reading. The circuit 15 is input the clock signal CK and the signal BAN. The circuit block 15 cooperates with the circuit block 12 in recognizing the moment when an internal reading sequence is to be started, and in recognizing whether the reading is to be a random or a burst type.

According to the method of the present invention, to perform a burst reading, the memory 2 must be provided with the clock signal at the same time as a pulse is imposed on the signal LAN for the latter to encompass at least one rising edge of the clock signal. The read starting address will be the valid one at the time of the pulse LAN.

The information as to whether the required reading is a random or a burst type should be received at once so that, for the former, the read amplifiers 8 can be turned off directly after the reading step, and for the latter, the memory can be made ready for a second reading as soon as a signal BAN having a low logic value is received.

After an access time of random type, the signal BAN is brought to a low, indicating the actual start of the burst mode reading to the memory 2. From this time onwards, the memory 2 will output one data item at each rising edge of the clock signal CK.

Address incrementing is handled internally in the memory. Since in addressing the memory some particular situations may be encountered whereby the internal reading needs more time to complete the read operation, or the data read cannot be fully utilized. The control logic 3 is operated to bring the signal at the output AD to a high to keep step with the clock CK. Thus, the microprocessor is told that the data being presented at the memory outputs is invalid.

Figure 3:
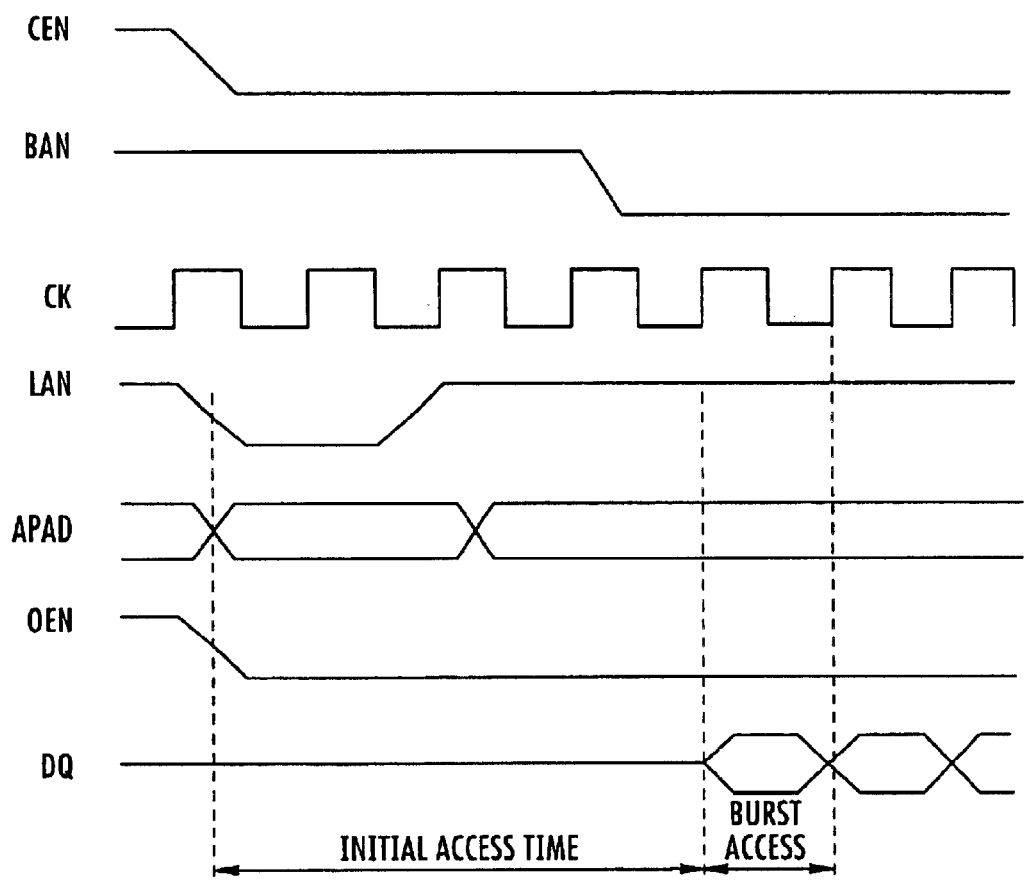
FIG. 3 graphically illustrates control signals plotted against the same time base as they appear in a memory device equipped with the read circuit according to the present invention.

The signal AD will be returned to a logic low again, only after the reading has been synchronized automatically. FIG. 3 shows schematically the timing of the read and control signals appearing iii the memory 2 during the burst mode reading step. To best appreciate every aspect of this invention, it should be considered that the time taken to effect a reading internally of the memory device long exceeds the period of the clock signal CK. Accordingly, a synchronized reading to the clock signal can only be obtained by providing the burst read mode with some special features.

The burst read operation is actually carried out in parallel and by following an operative pipeline mode. Rather than reading one memory word at a time, several words are read internally in parallel. Following a first reading in the random mode, i.e., a reading which takes the same time as a random access, a number of read words in the burst mode become available for presentation at the memory outputs.

The time taken to output the memory words serially is utilized to carry out a new reading at the next address. In this way, a higher reading rate can be achieved than with random reading. This is done at the expense of a small increase of the circuit complexity and, therefore, of the semiconductor area. But the benefit to be derived is much greater than the disadvantage due to this circular space increase.

In the abnormal instance of the user driving the control signals incorrectly, and the memory lacking sufficient information to decide on whether the reading requested should be of the random or the burst type (e.g., in the event of the high state of the signal LAN being prolonged), the memory would automatically settle for a burst type of operation.

At the end of the first internal reading of the random type, the control logic 13 increments the address of the memory location for the next reading, and checks the output buffer stages. This is done because the synchronization circuit to the clock signal CK, and hence the activation of the control logic 3 only takes place as the signal BAN is brought to a low. Therefore, to make best use of the time lapse between the end of the first random reading and the instant the synchronous circuitry is activated, the control logic 13 is put in charge of making ready for a second reading.

It should be noted that since the access time of the first reading is of a random type, its result is unrelated to the clock rate. As the control logic 3 takes over in the read operation handling, it also sets the address counter 7, read amplifiers 8, latches 10, and output buffers 11.

The burst read mode will be stopped by the occurrence of a rise in the signal "chip enable", or a new pulse in the signal LAN, or a rise in the signal BAN. Since the memory words are read in parallel in the burst mode, they are required to be addressed sequentially to the output. If the initial address is not aligned to the lowest address thereof, the control logic 3 will issue the signal AD to re-align the reading.

The timing signals of the read amplifiers 8 are designated "bldisch" and "eqlz" in FIG. 4. During the random reading step, both signals are controlled by analog circuitry, which is not shown because it is conventional. A signal "salatch" is used for controlling the latch registers 10 of the read amplifiers 8. These registers 10, together with those provided in the output stages 11, represent a pipeline structure. In fact, they allow the data of one reading to be retained through all the time required to present it at the output, while the read amplifiers 8 are being used for a subsequent reading.

The decode portion 9 of the read amplifiers include a multiplexer and a counter which is controlled from the state machine incorporated to the control logic 3. Using a signal "incsel", the logic 3 orders the serialization of the memory words that have been read in parallel. The latch registers incorporated to the output stages 11 allow the output data to be memorized for one clock period previous to the rising edge of the clock signal for which the output stage should be active. In this way, the time taken to transfer data from the read amplifiers to the output stages is made much shorter.

Figure 5:
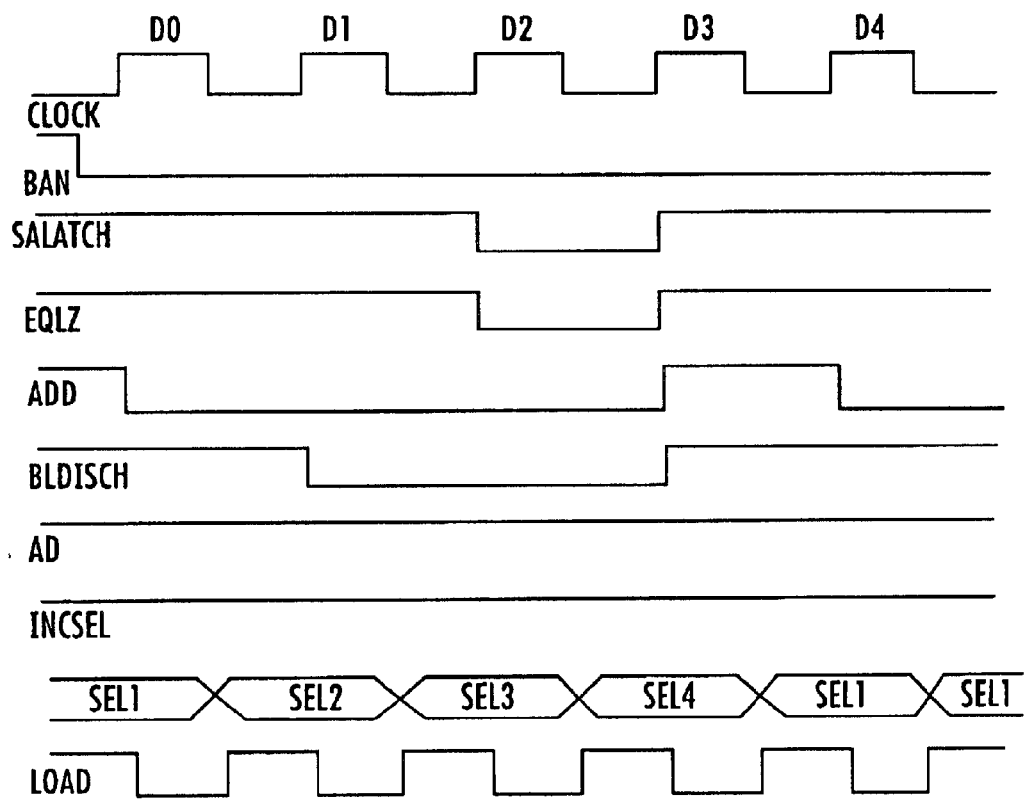
FIG. 5 graphically illustrates control signals plotted against the same time base as they appear in FIG. 4.

FIG. 5 shows graphically the signals present in the read circuit portion of this invention, plotted against the same time base. The circuit and method of this invention solve the technical problem and offer a number of advantages, foremost among which is the fact that the synchronous burst read mode is provided by the memory device in a fully automatic manner, and is not limited by the number of successive memory words following the access starting address.

The burst read mode is enabled with no depth limitations, thereby providing a substantially continuous burst. Accordingly, the memory is not limited by any predetermined number of successive words after that associated with the starting address, but it is limited only by the dimensions of the memory matrix.

That which is claimed is:

1. A read control circuit for an electronic memory device integrated on a semiconductor substrate, the electronic memory device comprising an address counter, a non-volatile memory matrix with row and column decoders connected to respective outputs of the address counter, an address transition detect (ATD) circuit for detecting an input transition as the electronic memory device is being accessed, and read amplifiers and associated registers for transferring data read from the electronic memory device to an output thereof, the read control circuit comprising:
   a burst read detection circuit including a first input for receiving a clock signal and a second input for receiving a logic signal for enabling reading in a burst mode; and
   a burst read control logic circuit having an input connected to said burst read detection circuit and having outputs connected to the read amplifiers and the associated registers to activate a parallel reading of a plurality of memory words within a single period of the clock signal with respect to receiving the logic signal.

2. A read control circuit according to claim 1, wherein said burst read control logic circuit includes an input connected to an output of the ATD circuit, an input for receiving a valid address logic signal, and an input for the clock signal.

3. A read control circuit according to claim 1, further comprising a random read control logic circuit connected to the ATD circuit for handling a random accessing of the memory matrix, and wherein said random read control logic circuit is also connected bi-directionally to said burst read control logic circuit.

4. A read control circuit according to claim 1, wherein the outputs of said burst read control logic circuit and outputs of said burst read detection circuit are connected to the address counter.

5. A read control circuit according to claim 1, wherein said burst read control logic circuit includes an additional output for a wait logic signal whenever a time to complete the read operation exceeds at least one clock period and whenever the data read is unusable.

6. A read control circuit according to claim 1, wherein a first reading of the electronic memory device is performed in a random mode.

7. A read control circuit according to claim 1, wherein the plurality of memory words read in parallel are read in the burst mode and are addressed sequentially to the output by the associated registers, and wherein a time period to output the plurality of memory words serially is used to perform a new reading at a next address.

8. A read control circuit according to claim 1, wherein said burst read control logic circuit comprises a state machine.

9. A read control circuit according to claim 1, wherein the memory-matrix comprises an EEPROM memory matrix.

10. A read control circuit for an electronic memory device integrated on a semiconductor substrate, the electronic memory device comprising an address counter, a non-volatile memory matrix with row and column decoders connected to respective outputs of the address counter, an address transition detect (ATD) circuit for detecting an input transition as the electronic memory device is being accessed, and read amplifiers and associated registers for transferring data read from the electronic memory device to an output thereof, the read control circuit comprising:

a burst read detection circuit including a first input for receiving a clock signal and a second input for receiving a logic signal for enabling reading in a burst mode;

a burst read control logic circuit having an input connected to said burst read detection circuit and having outputs connected to the read amplifiers and the associated registers to activate a parallel reading of a plurality of memory words within a single period of the clock signal with respect to receiving the logic signal; and a random read control logic circuit connected to the ATD circuit for handling a random accessing of the memory matrix so that a first reading of the electronic memory device is performed in a random mode, and said random read control logic circuit is also connected bi-directionally to said burst read control logic circuit.

11. A read control circuit according to claim 10, wherein said burst read control logic circuit includes an input connected to an output of the ATD circuit, an input for receiving a valid address logic signal, and an input for the clock signal.

12. A read control circuit according to claim 10, wherein the outputs of said burst read control logic circuit and outputs of said burst read detection circuit are connected to the address counter.

13. A read control circuit according to claim 10, wherein said burst read control logic circuit includes an additional output for a wait logic signal whenever a time to complete the read operation exceeds at least one clock period and whenever the data read is unusable.

14. A read control circuit according to claim 10, wherein the plurality of memory words read in parallel are read in the burst mode and are addressed sequentially to the output by the associated registers, and wherein a time period to output the plurality of memory words serially is used to perform a new reading at a next address.

15. A read control circuit according to claim 10, wherein said burst read control logic circuit comprises a state machine.

16. A read control circuit according to claim 10, wherein the memory-matrix comprises an EEPROM memory matrix.

17. A non-volatile memory device comprising:

a memory matrix;

a row decoder and a column decoder connected to said memory matrix;

an address counter including outputs connected to inputs of said row and column decoders;

an address transition detect (ATD) circuit for detecting an input transition as the non-volatile memory device is being accessed;

read amplifiers and associated registers connected to said memory matrix for transferring stored data therefrom to an output of the non-volatile memory device; and a read control circuit comprising a burst read detection circuit including a first input for receiving a clock signal and a second input for receiving a logic signal for enabling reading in a burst mode, and a burst read control logic circuit having an input connected to said burst read detection circuit and having outputs connected to said read amplifiers and associated registers to activate a parallel reading of a plurality of memory words within a single period of the clock signal with respect to receiving the logic signal.

18. A non-volatile memory device according to claim 17, wherein said burst read control logic circuit includes an input connected to an output of said ATD circuit, an input for receiving a valid address logic signal, and an input for the clock signal.

19. A non-volatile memory device according to claim 17, further comprising a random read control logic circuit connected to said ATD circuit for handling a random accessing of said memory matrix, and wherein said random read control logic circuit is also connected bi-directionally to said burst read control logic circuit.

20. A non-volatile memory device according to claim 17, wherein the outputs of said burst read control logic circuit and outputs of said burst read detection circuit are connected to said address counter.

21. A non-volatile memory device according to claim 17, wherein said burst read control logic circuit includes an additional output for a wait logic signal whenever a time to complete the read operation exceeds at least one clock period and whenever the data read is unusable.

22. A non-volatile memory device according to claim 17, wherein a first reading of the non-volatile memory device is performed in a random mode.

23. A non-volatile memory device according to claim 17, wherein the plurality of memory words read in parallel are read in the burst mode and are addressed sequentially to the output by said associated registers, and wherein a time period to output the plurality of memory words serially is used to perform a new reading at a next address.

24. A non-volatile memory device according to claim 17, wherein said burst read control logic circuit comprises a state machine.

25. A non-volatile memory device according to claim 17, wherein said memory-matrix comprises an EEPROM memory matrix.

26. A non-volatile memory device according to claim 17, further comprising a substrate wherein the non-volatile memory device is formed thereon and adjacent a microprocessor also formed thereon.

27. A method of reading data stored in a memory device including at least one non-volatile memory matrix, the method comprising:

accessing the memory matrix in a random read mode;

detecting a request for access in a burst mode; and executing a parallel reading of a plurality of memory words within a single time period clocked by a clock signal with respect to detecting the request for access in the burst read mode;

wherein detecting the request for access in a burst read mode is performed using a burst read detection circuit that includes a first input for receiving a clock signal and a second input for receiving a logic signal for enabling reading in the burst mode; and wherein executing the parallel reading is performed using a burst read control logic circuit having an input connected to the burst read detection circuit and having outputs connected to read amplifiers and associated registers of the memory device.

28. A method according to claim 27, wherein the at least one memory word read in parallel in the burst mode is addressed sequentially to an output of the memory device, and a period of time taken to output the plurality of memory words serially is used to perform a new reading at a next memory address.

29. A method according to claim 28, wherein the next memory address for the new reading is updated automatically.

30. A method according to claim 27, wherein the burst read control logic circuit includes an input connected to an output of an address transition detect (ATD) circuit, an input for receiving a valid address logic signal, and an input for the clock signal.

31. A method according to claim 30, wherein the integrated electronic memory device further comprises a random read control logic circuit connected to the ATD circuit for handling a random accessing of the memory matrix, and wherein the random read control logic circuit is also connected bi-directionally to the burst read control logic circuit.

32. A method according to claim 27, wherein the outputs of the burst read control logic circuit and outputs of the burst read detection circuit are connected to an address counter.

33. A method according to claim 27, wherein the burst read control logic circuit includes an additional output for a wait logic signal whenever a time to complete the read operation exceeds at least one clock period and whenever the data read is unusable.

34. A method according to claim 27, wherein a first reading of the integrated electronic memory device is performed in a random mode.

35. A method according to claim 27, wherein the burst read control logic circuit comprises a state machine.

36. A method according to claim 27, wherein the memory-matrix comprises an EEPROM memory matrix.

* * * * *